United States Patent
Umeda et al.

(10) Patent No.: US 11,069,538 B2
(45) Date of Patent: Jul. 20, 2021

(54) SEMICONDUCTOR DEVICE AND METHOD OF MANUFACTURING SEMICONDUCTOR DEVICE

(71) Applicant: SHINDENGEN ELECTRIC MANUFACTURING CO., LTD., Tokyo (JP)

(72) Inventors: Soichiro Umeda, Saitama (JP); Atsushi Kyutoku, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 3 days.

(21) Appl. No.: 16/631,003

(22) PCT Filed: Oct. 26, 2017

(86) PCT No.: PCT/JP2017/038759
§ 371 (c)(1),
(2) Date: Jan. 14, 2020

(87) PCT Pub. No.: WO2019/082346
PCT Pub. Date: May 2, 2019

(65) Prior Publication Data
US 2020/0227280 A1   Jul. 16, 2020

(51) Int. Cl.
*H01L 21/48* (2006.01)
*H01L 23/495* (2006.01)
*H01L 23/498* (2006.01)
*H01L 23/00* (2006.01)
(Continued)

(52) U.S. Cl.
CPC ........ *H01L 21/4853* (2013.01); *H01L 21/485* (2013.01); *H01L 21/56* (2013.01);
(Continued)

(58) Field of Classification Search
CPC ... H01L 21/4853; H01L 21/485; H01L 21/56; H01L 21/8234; H01L 2224/3226;
(Continued)

(56) References Cited

U.S. PATENT DOCUMENTS

2015/0221582 A1* 8/2015 Miyakawa ............ H01L 24/35
257/676
2015/0289369 A1 10/2015 Sunaga et al.
(Continued)

FOREIGN PATENT DOCUMENTS

JP 2012-212713 A 11/2012
JP 2015-12065 A 1/2015
(Continued)

OTHER PUBLICATIONS

International Application No. PCT/JP2017/038759, International Search Report, dated Jan. 16, 2018.
(Continued)

*Primary Examiner* — David Vu
*Assistant Examiner* — Brandon C Fox
(74) *Attorney, Agent, or Firm* — Marshall, Gerstein & Borun LLP

(57) ABSTRACT

The one end portion of the connector of the semiconductor device includes: a horizontal portion; a first inclined portion that is connected to the horizontal portion and is located closer to the tip end side of the one end than the horizontal portion, and the first inclined portion having a shape inclined downward from the horizontal portion; and a control bending portion that is connected to the first inclined portion and positioned at the tip of the one end portion, and the control bending portion bent downwardly along the bending axis direction. The lower surface of the control bending portion is in contact with an upper surface of the second terminal.

15 Claims, 16 Drawing Sheets

(51) Int. Cl.
 *H01L 21/56* (2006.01)
 *H01L 21/8234* (2006.01)
 *H01L 21/60* (2006.01)
(52) U.S. Cl.
 CPC .... *H01L 21/8234* (2013.01); *H01L 23/49551* (2013.01); *H01L 23/49565* (2013.01); *H01L 2021/6027* (2013.01); *H01L 2224/3226* (2013.01); *H01L 2224/32258* (2013.01)
(58) Field of Classification Search
 CPC ..... H01L 2224/32258; H01L 23/49551; H01L 23/49565
 USPC .......................................... 257/676; 438/612
 See application file for complete search history.

(56) References Cited

U.S. PATENT DOCUMENTS

2016/0336257 A1* 11/2016 Choi ....................... H01L 24/37
2017/0025331 A1 1/2017 Kamiyama et al.
2019/0139866 A1* 5/2019 Kuraya .................. H01L 24/84
2020/0388588 A1* 12/2020 Choi ....................... H01L 24/40

FOREIGN PATENT DOCUMENTS

| | | |
|---|---|---|
| JP | 2015-050340 A | 3/2015 |
| JP | 2017054842 A | 3/2017 |
| JP | 2017-174927 A | 9/2017 |
| WO | WO-2014/068935 | 5/2014 |
| WO | WO-2016/084483 | 6/2016 |

OTHER PUBLICATIONS

International Application No. PCT/JP2017/038759, International Preliminary Report on Patentability, dated May 7, 2020.
Supplementary European Search Report for EP Application No. 17930124.7, dated Jul. 28, 2020.

* cited by examiner

SEMICONDUCTOR DEVICE AND METHOD OF MANUFACTURING SEMICONDUCTOR DEVICE

TECHNICAL FIELD

The present invention relates to a semiconductor device and a method of manufacturing the semiconductor device.

BACKGROUND ART

Conventionally, for example, a semiconductor device in which a semiconductor element is placed on a conductor layer of a substrate is known (see Patent Document 1). In this semiconductor device, the semiconductor element and the lead frame are joined with a connector via a conductive joining material such as solder, and the semiconductor element and the substrate are sealed with a sealing resin.

In such a conventional semiconductor device, for example, in order to connect a connector such as a gate clip and a semiconductor element (such as a MOSFET or 1GBT), a conductive bonding material such as a solder material may be applied. In this case, there is a limit to reducing the amount of solder while maintaining the solder particle size, and the cost increases as the solder particle size decreases.

And, in order to suppress the solder bridge between different electrodes without reducing the amount of solder, it is necessary to prevent the solder material that contacts the connector from protruding from the upper surface of the gate pad (the terminal) to which the control signal of the semiconductor element is input.

In consideration of electrical characteristics, it is necessary to reduce the area of the gate pad and increase the area of the source pad. For this reason, it is necessary to make the junction between the gate clip and the gate pad as small as possible.

Here, for example, as shown in FIG. 14, the conventional semiconductor device has a launch portion GC1 in which one end of a gate clip GC connected to the gate pad TG of the semiconductor element is launched downward, and a bent portion GC2.

The solder material is pressed by the punched portion GC1 and the bent portion GC2. For this reason, when the clearance is not sufficient, the solder material may protrude from the upper surface of the gate pad TG.

Therefore, it is necessary to expand the area of the gate pad TG (FIG. 14). In addition, the punched portion GC1 and the bent portion GC2 require at least two steps of a stamping step and a bending step, and the manufacturing cost is increased.

Thus, in the conventional semiconductor device, there is a problem that the conductive joining material cannot be prevented from protruding from the upper surface of the terminal, at the time of joining the terminal and the connector, corresponding to the shape of the terminal (the gate pad) to which the control signal is input, the connection portion of the connector (the gate pad) connected to the terminal is easily processed.

PRIOR ART DOCUMENTS

JP2015-12065

DISCLOSURE OF THE INVENTION

Problem to be Solved by the Invention

Therefore, an object of the present invention is to provide a semiconductor device capable of suppressing the conductive bonding material from protruding from the upper surface of the terminal when the terminal and the connector are bonded, and the joint portion of the connector connected to the terminal is easily processed, corresponding to the shape of the terminal to which the control signal is input.

Solution to Problem

A semiconductor device according to an aspect of the present invention includes: a substrate provided with a first conductive layer and a second conductive layer on an upper surface of the substrate; a semiconductor element disposed on the upper surface of the substrate, the semiconductor element having: a first terminal provided on a lower surface of the semiconductor element and electrically connected to the first conductive layer, and a second terminal provided on an upper surface of the semiconductor element and the second terminal receiving a control signal; a sealing portion that seals the substrate and the semiconductor element; a lead frame that has one end in contact with a upper surface of the second conductive layer provided at an end of the upper surface of the substrate in the sealing portion, and that has the other end exposed from the sealing portion; a first control conductive bonding material bonds between the second conductive layer and the one end of the lead frame at the end of the substrate, and has electrical conductivity; a connector has a one end portion contacting the upper surface of the second terminal of the semiconductor element in the sealing portion, and the other end in contact with the second conductive layer, the connector electrically connecting the second conductive layer and the second terminal on the upper surface of the semiconductor element; a second control conductive bonding material bonds between the upper surface of the second terminal of the semiconductor element and the one end of the connector, and has electrical conductivity; and a third control conductive bonding material bonds the second conductive layer of the substrate and the other end of the connector, and has electrical conductivity, wherein the one end portion of the connector comprising: a horizontal portion; a first inclined portion that is connected to the horizontal portion and is located closer to the tip end side of the one end than the horizontal portion, and the first inclined portion having a shape inclined downward from the horizontal portion; and a control bending portion that is connected to the first inclined portion and positioned at the tip of the one end portion, and the control bending portion bent downwardly along the bending axis direction, and wherein a lower surface of the control bending portion is in contact with an upper surface of the second terminal.

In the semiconductor device, wherein a lower surface side of the control bending portion is in contact with a center of an upper surface of the second terminal.

In the semiconductor device, wherein the lower surface side of the control bending portion is in line contact with the upper surface of the second terminal in the bending axis direction.

In the semiconductor device, wherein a thickness of the connector is thinner than a thickness of the lead frame.

In the semiconductor device, wherein the connector further includes a reference portion connected to the horizontal portion on the side opposite to the first inclined portion, and the reference portion having a width larger than the width of a horizontal portion.

In the semiconductor device, wherein the other end of the connector has:

a second inclined portion that is connected to the reference portion on the side opposite to the horizontal portion, and that is located closer to the tip end side of the other end portion than the reference portion, the second inclined portion having a shape inclined downward from the reference portion, and a tip portion that is connected to the second inclined portion, and is located at a tip of the other end portion of the connector, wherein the tip portion is bonded to the upper surface of the second conductive layer of the substrate by a third control conductive bonding material.

In the semiconductor device, wherein a height of the lower surface of the control bending portion of the connector from the substrate is higher than a height of the lower surface of the tip portion from the substrate.

In the semiconductor device, wherein the second control conductive bonding material is arranged along the bending axis direction in which the control bending portion of the connector is in line contact with the upper surface of the second terminal, and the second control conductive bonding material joins between the upper surface of the second terminal and the lower surface side of the control bending portion.

In the semiconductor device, wherein the upper surface of the second terminal has a rectangular shape, and wherein the second control conductive bonding material is positioned so as to surround the center of the upper surface of the second terminal, and the second control conductive bonding material joins between the lower surface of the control bending portion of the connector and the upper surface of the second terminal.

In the semiconductor device, wherein the lower surface side of the control bending portion is in line contact with and the upper surface of the second terminal in the bending axis direction passing through the center of the upper surface of the second terminal, and wherein the bending axis direction is parallel to one side of the rectangle of the second terminal.

In the semiconductor device, wherein a width of the control bending portion in the bending axis direction is the same as a width of the first inclined portion in the bending axis direction.

In the semiconductor device, wherein a width of the control bending portion in the bending axis direction is smaller than a width of the reference portion in the bending axis direction.

In the semiconductor device, wherein the semiconductor element is a MOSFET having the first terminal that is a drain terminal, the second terminal that is a gate terminal, and a source terminal which is a third terminal on the upper surface of the MOSFET, the third terminal having an area larger than an area of the second terminal, and wherein the lead frame is a control lead frame for transmitting the gate signal of the MOSFET.

In the semiconductor device, the semiconductor further comprising: a drain lead frame having one end electrically connected to the first terminal, which is a drain terminal in the sealing portion, and having the other end exposed from the sealing portion; and a source lead frame having one end electrically connected to the third terminal, which is a source terminal in the sealing portion, and having the other end exposed from the sealing portion.

A method of manufacturing a semiconductor device according to an aspect of the present invention includes: preparing a substrate provided with a first conductive layer and a second conductive layer on an upper surface of the substrate; arranging a semiconductor element on the upper surface of the substrate, the semiconductor element having: a first terminal provided on a lower surface of the semiconductor element and electrically connected to the first conductive layer, and a second terminal provided on an upper surface of the semiconductor element and the second terminal receiving a control signal; bringing one end of a lead frame into contact with a upper surface of the second conductive layer provided at an end of the upper surface of the substrate; bonding between the second conductive layer and the one end of the lead frame at the end of the substrate by a first control conductive bonding material, and the first control conductive bonding material has electrical conductivity; bringing a one end portion of a connector into contact with the upper surface of the second terminal of the semiconductor element, and the other end of a connector into contact with the second conductive layer; bonding between the upper surface of the second terminal of the semiconductor element and the one end of the connector by a second control conductive bonding material, and the second control conductive bonding material has electrical conductivity; bonding the second conductive layer of the substrate and the other end of the connector by a third control conductive bonding material, and the third control conductive bonding material has electrical conductivity; and sealing the substrate, the semiconductor element, and the one end of the lead frame by a sealing portion, wherein the one end portion of the connector comprising: a horizontal portion; a first inclined portion that is connected to the horizontal portion and is located closer to the tip end side of the one end than the horizontal portion, and the first inclined portion having a shape inclined downward from the horizontal portion; and a control bending portion that is connected to the first inclined portion and positioned at the tip of the one end portion, and the control bending portion bent downwardly along the bending axis direction, and wherein a lower surface of the control bending portion is in contact with an upper surface of the second terminal.

Effects of the Invention

A semiconductor device according to an aspect of the present invention includes: a substrate provided with a first conductive layer and a second conductive layer on an upper surface of the substrate; a semiconductor element disposed on the upper surface of the substrate, the semiconductor element having: a first terminal provided on a lower surface of the semiconductor element and electrically connected to the first conductive layer, and a second terminal provided on an upper surface of the semiconductor element and the second terminal receiving a control signal; a sealing portion that seals the substrate and the semiconductor element; a lead frame that has one end in contact with a upper surface of the second conductive layer provided at an end of the upper surface of the substrate in the sealing portion, and that has the other end exposed from the sealing portion; a first control conductive bonding material bonds between the second conductive layer and the one end of the lead frame at the end of the substrate, and has electrical conductivity; a connector has a one end portion contacting the upper surface of the second terminal of the semiconductor element in the sealing portion, and the other end in contact with the second conductive layer, the connector electrically connecting the second conductive layer and the second terminal on the upper surface of the semiconductor element; a second control conductive bonding material bonds between the upper surface of the second terminal of the semiconductor element and the one end of the connector, and has electrical conductivity; and a third control conductive bonding material bonds the second conductive layer of the substrate and the other end of the connector, and has electrical conductivity.

Furthermore, the one end portion of the connector comprising: a horizontal portion; a first inclined portion that is connected to the horizontal portion and is located closer to the tip end side of the one end than the horizontal portion, and the first inclined portion having a shape inclined downward from the horizontal portion; and a control bending portion that is connected to the first inclined portion and positioned at the tip of the one end portion, and the control bending portion bent downwardly along the bending axis direction. Furthermore, a lower surface of the control bending portion is in contact with an upper surface of the second terminal.

In the semiconductor device of the present invention, for example, the control bending portion and the first inclined portion of the connector joined to the second terminal can be formed only by bending.

Especially, the lower surface side of the control bending portion is brought into line contact with the center of the upper surface of the second terminal. Accordingly, a space, for preventing the second control conductive bonding material from protruding from the second terminal when the connector is mounted, can be provided between the first inclined portion and the first inclined portion. Thus, the area of the second terminal can be reduced.

That is, in the semiconductor device of the present invention, it is possible to easily process the joint portion of the connector connected to the terminal corresponding to the shape of the terminal to which the control signal is input. Furthermore, it is possible to suppress the conductive bonding material from protruding from the upper surface of the terminal when the terminal and the connector are bonded.

BRIEF DESCRIPTION OF THE DRAWINGS

FIG. 8B is a cross-sectional view showing an example of the configuration of the first lead frame L1 shown in FIG. 8A.

EMBODIMENTS FOR CARRYING OUT THE INVENTION

Embodiments of the present invention will now be described with reference to the accompanying drawings.

Figure 1:
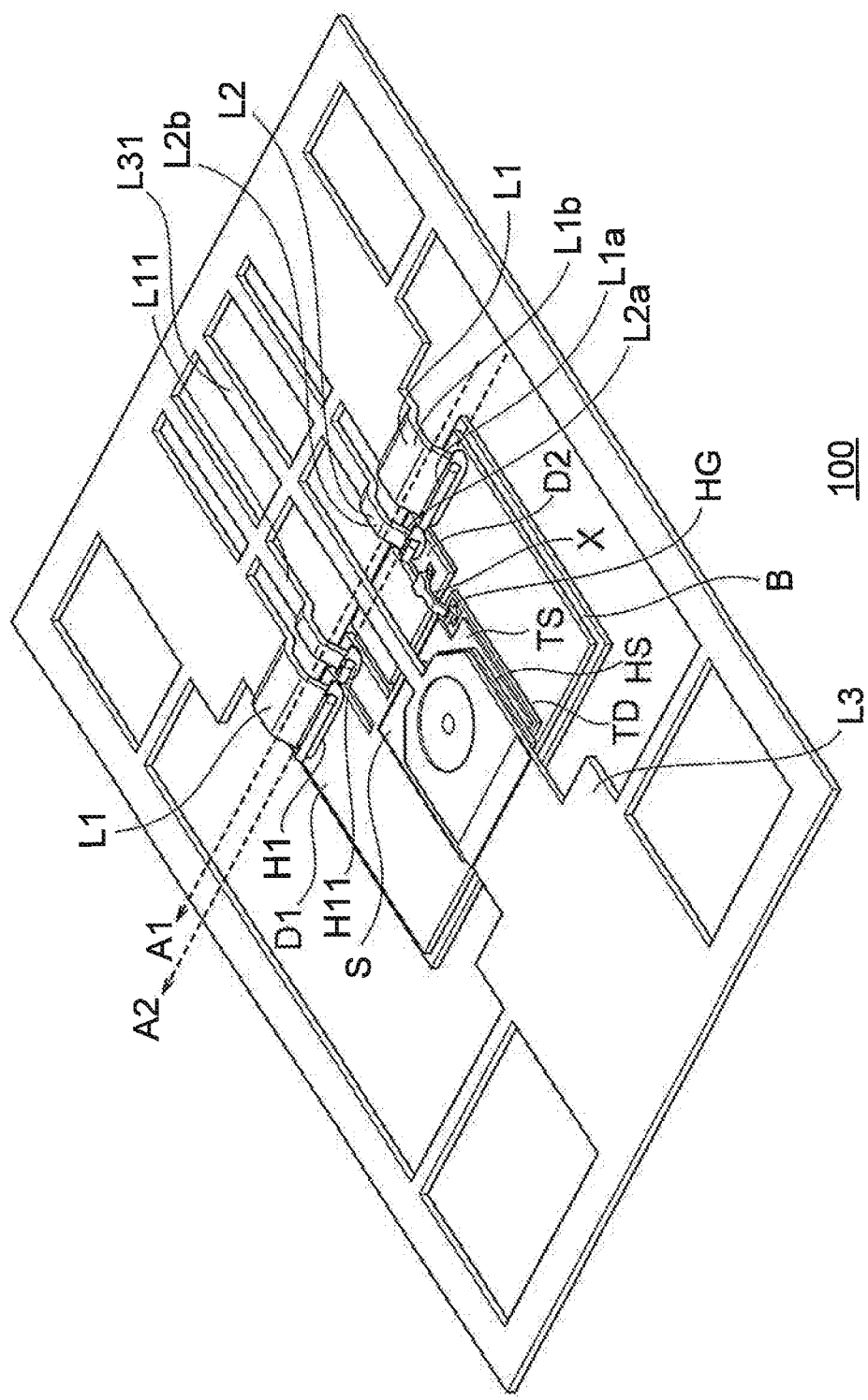
FIG. 1 is a perspective view showing an example of a configuration of a semiconductor device 100 before sealing.
Figure 2:
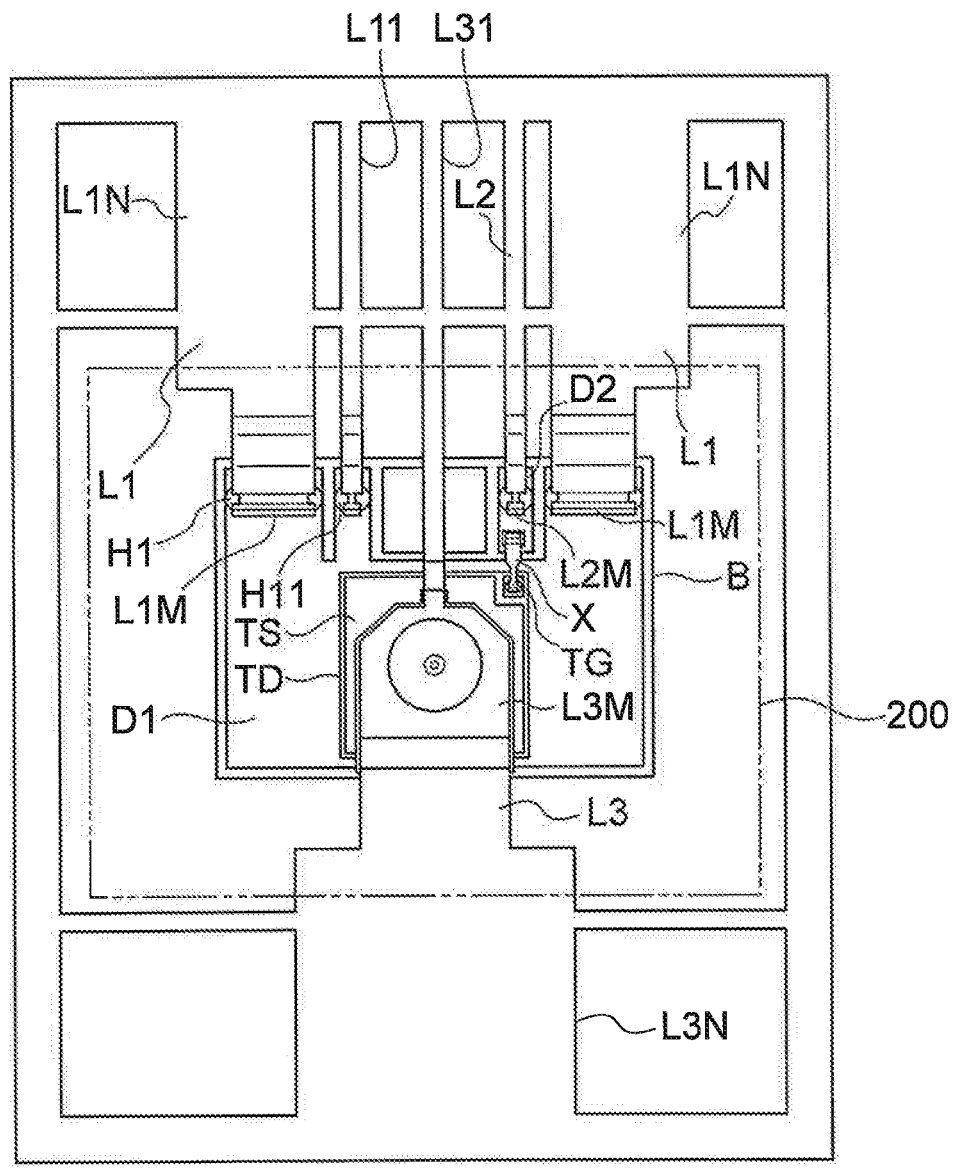
FIG. 2 is a top view showing an example of the configuration of the semiconductor device 100 after sealing and before cutting the lead frame.
Figure 3:
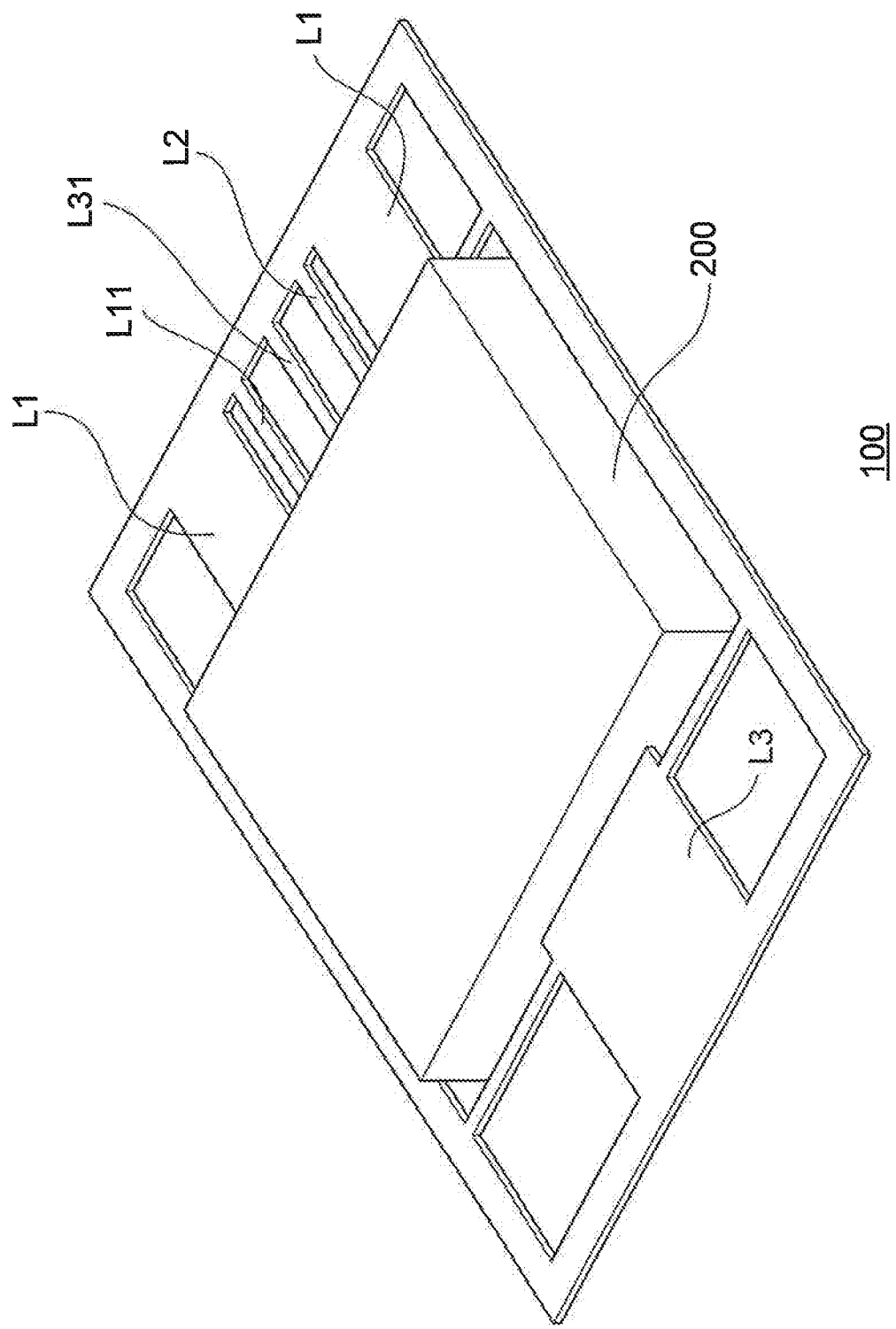
FIG. 3 is a perspective view showing an example of the configuration of the semiconductor device 100 after sealing and before cutting the lead frame.
Figure 4:
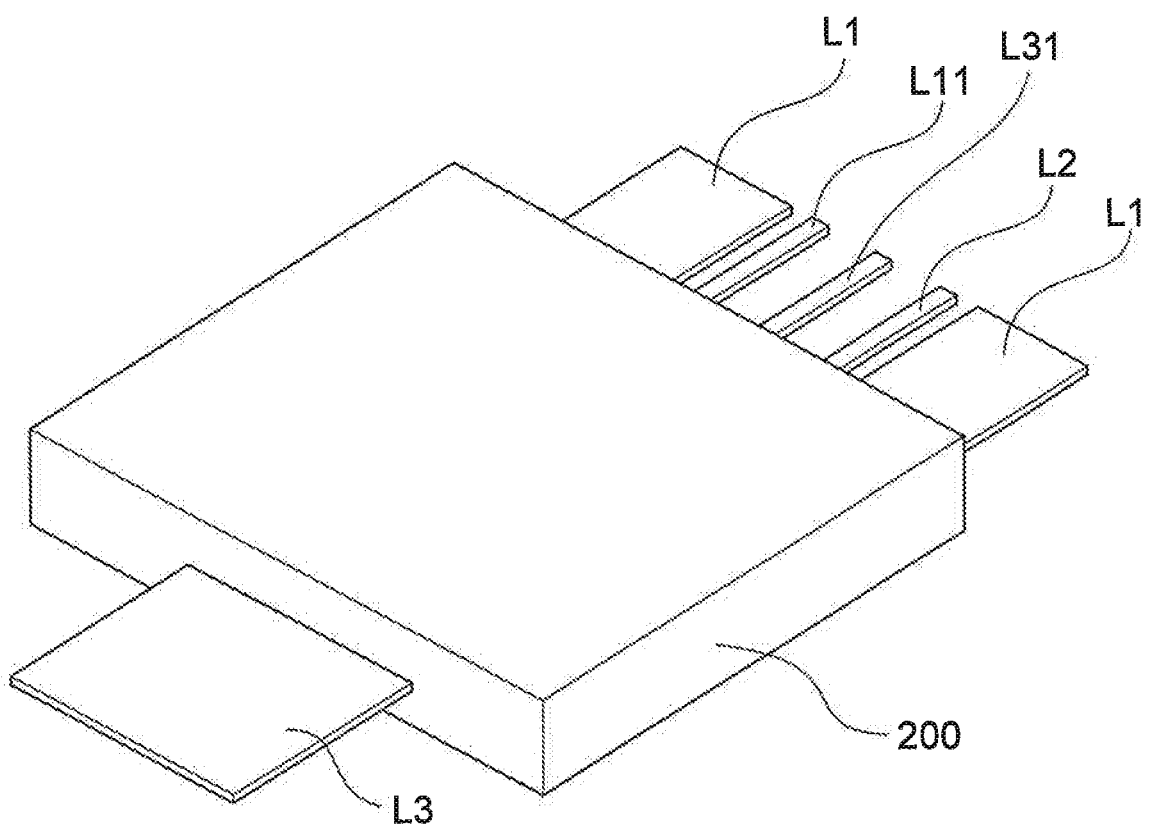
FIG. 4 is a perspective view showing an example of the configuration of the semiconductor device 100 after the lead frame is cut.

FIG. 1 is a perspective view showing an example of a configuration of a semiconductor device 100 before sealing. FIG. 2 is a top view showing an example of the configuration of the semiconductor device 100 after sealing and before cutting the lead frame. FIG. 3 is a perspective view showing an example of the configuration of the semiconductor device 100 after sealing and before cutting the lead frame. FIG. 4 is a perspective view showing an example of the configuration of the semiconductor device 100 after the lead frame is cut. In the example of FIG. 1, a case where there are two first lead frames L1 is shown. Moreover, the example of FIG. 2 is illustrated as if the sealing member was transmitted.

Figure 5A:
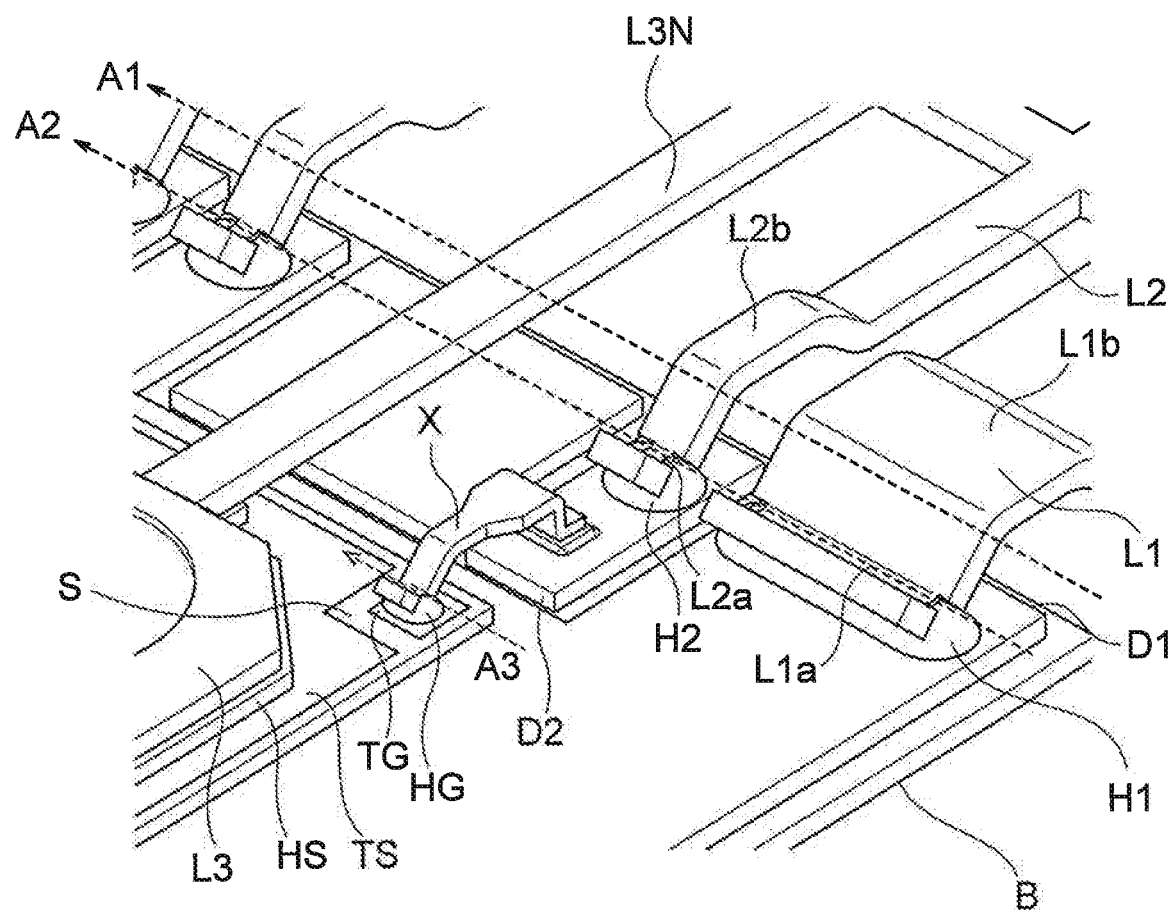
FIG. 5A is an enlarged perspective view of a region in the vicinity of the first and second lead frames L1, L2 and the connector X of the semiconductor device 100 shown in FIG. 1.
Figure 5B:
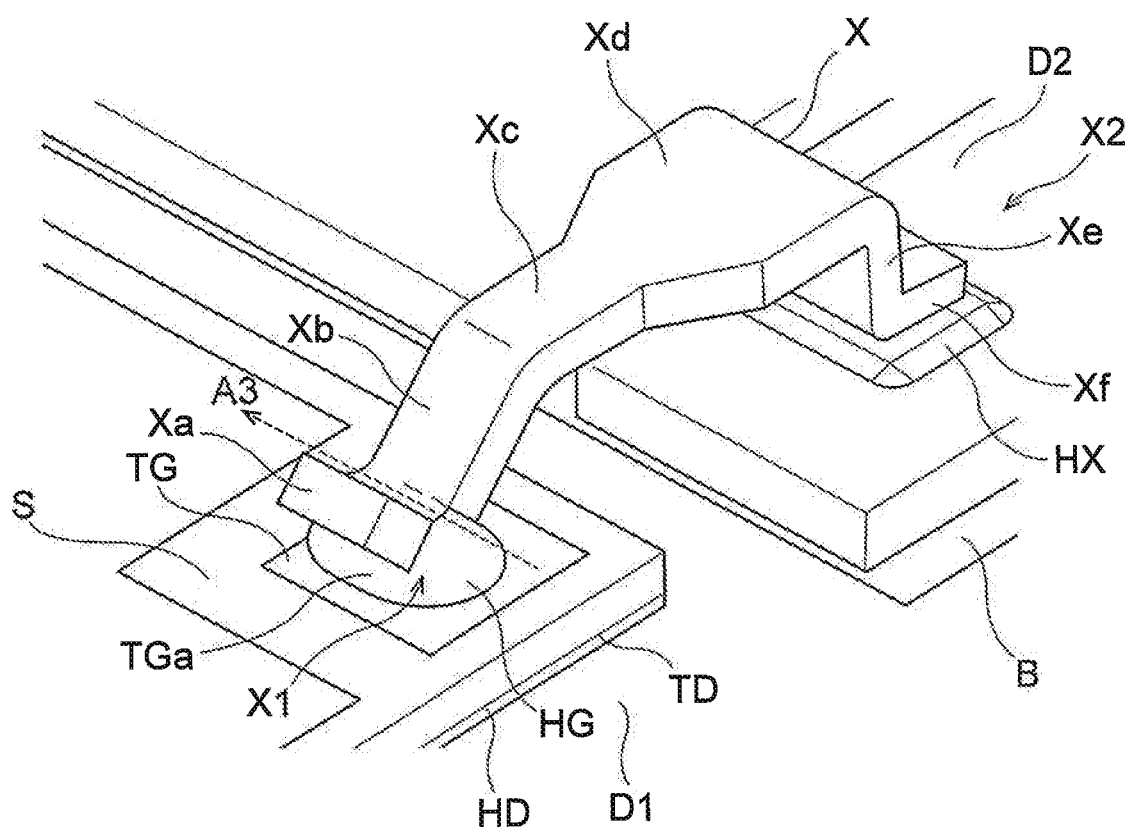
FIG. 5B is a perspective view further enlarging a region in the vicinity of the connector X shown in FIG. 5A.
Figure 5C:
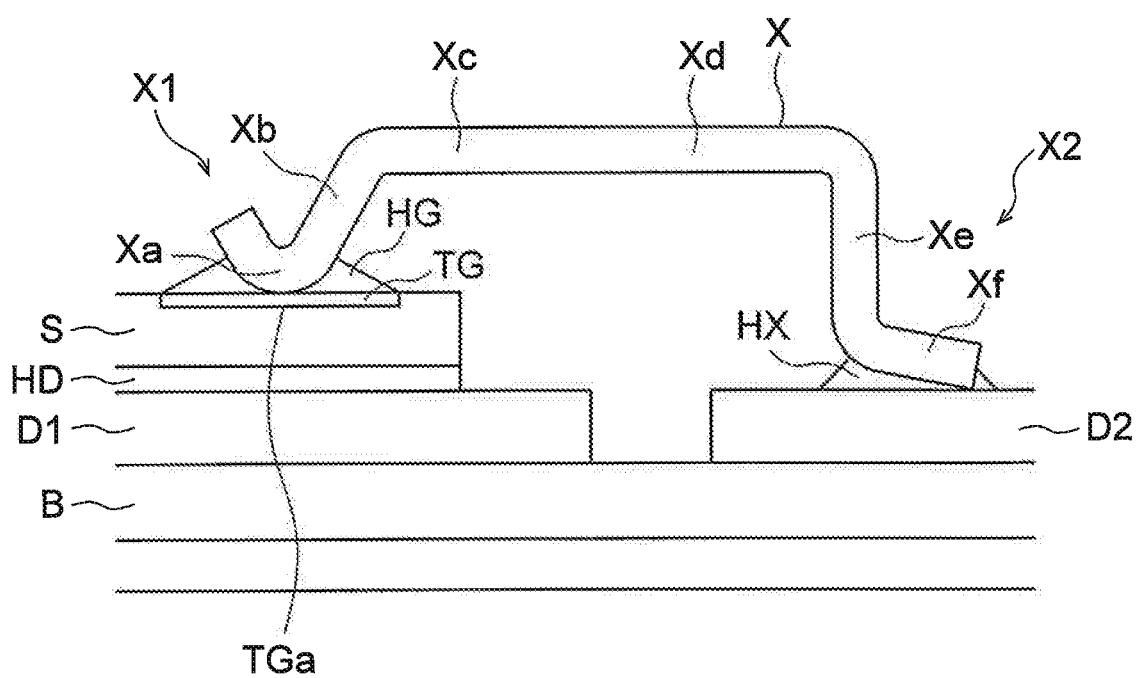
FIG. 5C is a side view showing an example of a side surface of a region in the vicinity of the connector X shown in FIG. 5B.

FIG. 5A is an enlarged perspective view of a region in the vicinity of the first and second lead frames L1, L2 and the connector X of the semiconductor device 100 shown in FIG. 1. FIG. 5B is a perspective view further enlarging a region in the vicinity of the connector X shown in FIG. 5A. FIG. 5C is a side view showing an example of a side surface of a region in the vicinity of the connector X shown in FIG. 5B.

For example, as shown in FIGS. 1 to 4, the semiconductor device 100 includes a substrate B, a semiconductor element S, a sealing portion 200, a first lead frame (a drain lead frame) L1, a detection lead frame. L11, a first conductive bonding material H1, a drain conductive bonding material HD, a second lead frame (control lead frame) L2, a second conductive bonding material (a first control conductive bonding material) H2, a second control conductive bonding material HG, a third control conductive bonding material HX, a connector X, a third lead frame (a source lead frame) L3, a source conductive bonding material HS, and a detection lead frame L31.

As shown in FIGS. 1 and 2, the substrate B is provided with a plurality of conductive layers (a first conductive layer D1 and a second conductive layer D2) on the upper surface of the substrate B.

Also, as shown in FIGS. 1 and 2, the semiconductor element S is arranged on the upper surface of the substrate B. In the semiconductor element S, the first terminal TD on the lower surface side of the semiconductor element S is electrically connected to the first conductive layer D1 provided on the upper surface of the substrate B.

For example, as shown in FIGS. 1 and 2, the semiconductor element S includes a first terminal (a drain terminal) TD, a second terminal (a gate terminal) TG, and a third terminal (a source terminal) TS.

The first terminal TD is provided on the lower surface of the semiconductor element S, and is electrically connected to the first conductive layer D1.

The second terminal TG is provided on the upper surface of the semiconductor element S, and a control signal (a gate signal) is input to the second terminal TG.

Note that the semiconductor element S is, for example, a MOSFET. In this case, the semiconductor element S is a MOSFET having a first terminal TD which is a drain terminal is provided on a lower surface of the MOSFET, a second terminal TG which is a gate terminal is provided on the upper surface of the MOSFET, and a third terminal TS which is a source terminal on the upper surface of the MOSFET.

The semiconductor element S may be other semiconductor elements such as 1GBT other than MOSFET.

As shown in FIGS. 1 and 2, the first lead frame L1 has one end L1M electrically connected to the first terminal TD which is a drain terminal in the sealing portion 200, and has the other end L1N exposed from the sealing portion 200.

In particular, the one end portion L1M of the first lead frame L1 is in contact with the upper surface of the first conductive layer D1 at the end extending in the side direction A1 of the upper surface of the substrate B in the sealing portion 200. And, the other end portion L1N of the first lead frame L1 is exposed from the sealing portion 200.

The one end portion L1M of the first lead frame L1 includes a first arch portion L1b and a first bent portion L1a.

The first arch portion L1b is provided so as to protrude upward along the reference direction A2.

And, the first bending portion L1a is connected with the first arch portion L1b, and is located in the tip end side rather than the first arch portion L1b. Furthermore, the first bent portion L1a is bent so as to protrude downward along the reference direction A2.

The lower surface side of the first bent portion L1a is in line contact with the upper surface of the first conductive layer D12 along the reference direction A2.

Further, the first conductive bonding material H1 bonds between the upper surface of the first conductive layer D1 and the lower surface side of the one end L1M of the first lead frame L1 at the end of the substrate B. Furthermore, the first conductive bonding material H1 has electrical conductivity.

Note that the first conductive bonding material H1 is, for example, a solder material.

Further, one end of the detection lead frame L11 is electrically connected to the first terminal TD which is a drain terminal in the sealing unit 200. Furthermore, the other end portion of the detection lead frame L11 is exposed from the sealing portion 200.

The detection lead frame L11 is for detecting the drain voltage of the semiconductor element S, for example.

Then, the detection conductive bonding material H11 bonds the first conductive layer D1 and one end portion of the detection lead frame L11. Further, the detection conductive bonding material H11 has electrical conductivity.

Note that the conductive bonding material for detection H11 is, for example, a solder material.

For example, as shown in FIGS. 1 and 2, one end portion L2M of the second lead frame L2 is in contact with the upper surface of the second conductive layer provided at the end of the upper surface of the substrate B in the sealing portion 200. Further, the other end portion L2N of the second lead frame L2 is exposed from the sealing portion 200.

The second lead frame L2 is a control lead frame for transmitting the gate signal of the MOSFET (the semiconductor element S) described above.

Then, the second conductive bonding material (the first control conductive bonding material) H2 bonds between the first conductive layer D1 and the one end L2M of the second lead frame L2 at the end of the substrate B. Further, the second conductive bonding material (the first control conductive bonding material) H2 has electrical conductivity.

Note that the second conductive bonding material H2 is, for example, a solder material.

Also, the one end portion L2M of the second lead frame L2 includes a second arch portion L2b and a second bent portion L2a.

The second arch portion L2b is provided so as to protrude upward along the reference direction A2.

The second bent portion L2a is connected to the second arch portion L2b and is located on the tip side with respect to the second arch portion L2b. The second bent portion L2a is bent so as to protrude downward along the reference direction A2.

The lower side of the second bent portion L2a is in line contact with the upper surface of the second conductive layer D2 along the reference direction A2.

Further, the width in the reference direction A2 of the one end portion L1M of the first lead frame L1 is set to be larger than the width in the reference direction A2 of the one end portion L2M of the second lead frame L2.

Also, one end L3M of the third lead frame L3 is electrically connected to the third terminal TS which is the source terminal on the upper surface of the semiconductor element S. Furthermore, the other end L3N of the third lead frame L3 is exposed from the sealing portion 200.

Then, the source conductive bonding material HS bonds between the third terminal TS and the one end L3M of the third lead frame L3. Further, the source conductive bonding material HS has electrical conductivity.

The source conductive bonding material HS is, for example, a solder material.

The one end of the detection lead frame L31 is electrically connected to the third terminal TS that is the source terminal on the upper surface of the semiconductor element S (that is, the one end of the detection lead frame L31 extends from the third lead frame L3). Further, the other end portion of the detection lead frame L31 is exposed from the sealing portion 200.

The detection lead frame L31 is for detecting the voltage of the source of the semiconductor element S, for example.

Further, as shown in FIGS. 1 to 4, the sealing portion 200 is configured to seal the substrate B and the semiconductor element S.

First Example

Here, in the example shown in FIGS. 5A, 5B, and 5C, the area of the source terminal, that is the third terminal TS on the upper surface of the semiconductor element S, is larger than the area of the second terminal TG that is the gate terminal.

The connector X is electrically connected between the second conductive layer D2 and the second terminal (gate terminal) TG on the upper surface side of the semiconductor element S, as shown in FIGS. 5A, 5B and 5C, for example.

For example, as shown in FIGS. 5A, 5B, and 5C, the connector X has one end X1 in contact with the upper surface of the second terminal TG of the semiconductor element S in the sealing portion 200, and has the other end X2 in contact with the second conductive layer D2.

Here, the second control conductive bonding material HG bonds between the upper surface of the second terminal TG of the semiconductor element S and the one end portion X1 of the connector X. Further, the second control conductive bonding material HG has electrical conductivity.

Note that the second control conductive bonding material HG is, for example, a solder material.

Further, the third control conductive bonding material HX bonds between the second conductive layer D2 of the substrate B and the other end X2 of the connector X. Furthermore, the third control conductive bonding material HX has conductivity.

Note that the third control conductive bonding material HX is, for example, a solder material.

That is, the connector X is configured to electrically connect the second conductive layer D2 and the second terminal (gate terminal) TG on the upper surface side of the semiconductor element S, by the second and third control conductive bonding materials HG and HX, The one end X1 of the connector X includes, for example, a horizontal portion Xc, a first inclined portion Xb, a control bending portion Xa, and a reference portion Xd, as shown in FIGS. 5B and 5C.

And, the horizontal portion Xc is arranged in parallel with the upper surface of the substrate B, for example, as shown in FIGS. 5A, 5B, and 5C.

Further, for example, as shown in FIGS. 5A, 5B, and 5C, the first inclined portion Xb is connected to the horizontal portion Xc, and is located closer to the tip end side of the one end portion X1 than the horizontal portion Xc. Furthermore, the first inclined portion Xb has a shape inclined downward from the horizontal portion Xc.

Further, for example, as shown in FIG. 5B, the control bending portion Xa is connected to the first inclined portion Xb and located at the tip of the one end portion X1. Further, the control bending portion Xa is bent so as to protrude downward along the bending axis direction A3.

The lower surface of the control bending portion Xa is in contact with the upper surface of the second terminal TG. In particular, the lower surface side of the control bending portion Xa is in contact with the center TGa of the upper surface of the second terminal TG.

Further, the lower surface side of the control bending portion Xa is in line contact with the upper surface of the second terminal TG in the bending axis direction A3, for example, as shown in FIG. 5C.

The width of the control bending portion Xa in the bending axis direction A3 is the same as the width of the first inclined portion Xb in the bending axis direction A3.

In addition, the reference portion Xd is connected to the horizontal portion Xc on the side opposite to the first inclined portion Xb, and has a width larger than the width of the horizontal portion Xc.

The width of the bending portion for control Xa in the bending axis direction A3 is set to be narrower than the width of the bending portion in the bending axis direction A3 of the reference portion Xd.

Here, the second control conductive bonding material HG is arranged, along the bending axis direction A3 where the control bending portion Xa of the connector X makes line contact with the upper surface of the second terminal TG, for example, as shown in FIGS. 5A, 5B, and 5C. Furthermore, the second control conductive bonding material HG bonds the upper surface of the second terminal TG and the lower surface side of the control bent portion Xa.

The upper surface of the second terminal TG has a rectangular shape, for example, as shown in FIGS. 5A, 5B, and 5C.

The second control conductive bonding material HG is positioned so as to surround the center TGa on the upper surface of the second terminal TG, as shown in FIG. 5B. Thus, the second control conductive bonding material HG bonds the lower surface of the control bending portion Xa of the connector X and the upper surface of the second terminal TG.

For example, as shown in FIG. 5C, the lower surface side of the control bending portion Xa of the connector X and the upper surface of the second terminal TG are in line contact with the bending axis direction A3 passing through the center TGa on the upper surface of the second terminal TG.

The bending axis direction A3 is parallel to one side of the rectangle of the second terminal TG as shown in FIGS. 5A, 5B, and 5C, for example.

Meanwhile, the other end portion X2 of the connector X includes a second inclined portion Xe and a tip end portion Xf.

The second inclined portion Xe is connected to the reference portion Xd on the side opposite to the horizontal portion Xc, and is located closer to the tip end side of the other end portion X2 than the reference portion Xd. Furthermore, the second inclined portion Xe has a shape inclined downward from the reference portion Xd.

And, the tip end portion Xf is connected to the second inclined portion Xe, and the tip end portion Xf is located at the tip of the other end X2, as shown in FIGS. 5A, 5B, and 5C, for example.

The tip portion Xf is bonded to the upper surface of the second conductive layer D2 of the substrate B, by the third control conductive bonding material HX.

The height of the lower surface of the control bending portion Xa of the connector X from the upper surface of the substrate B is set to be higher than the height of the lower surface of the tip end portion Xf from the upper surface of the substrate B.

Note that the thickness in the vertical direction of the connector X is set to be thinner than the thickness in the vertical direction of the second lead frame L2.

Thereby, the bending process of the miniaturized connector X can be facilitated.

Second Example

Figure 6:
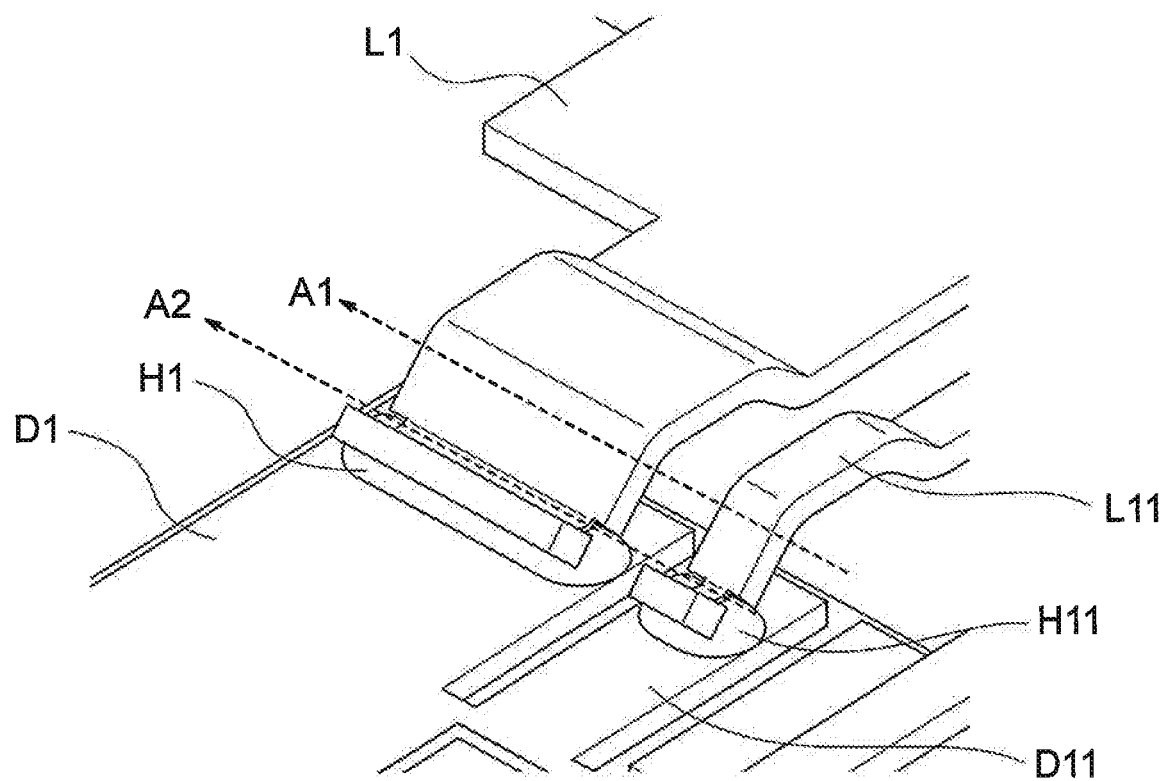
FIG. 6 is an enlarged perspective view of a region in the vicinity of the first lead frame L1 and the detection lead frame L11 of the semiconductor device 100 shown in FIG. 1.
Figure 7:
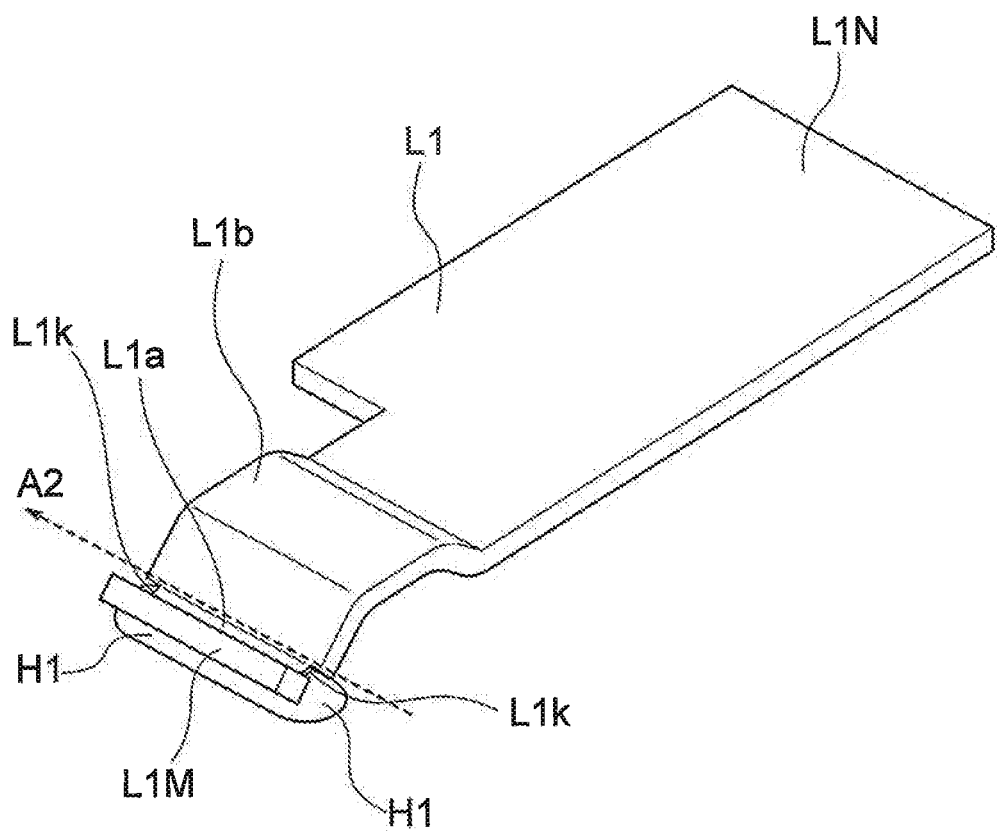
FIG. 7 is a perspective view showing an example of the configuration of the first lead frame L1 and the first conductive bonding material H1 shown in FIG. 6.
Figure 8A:
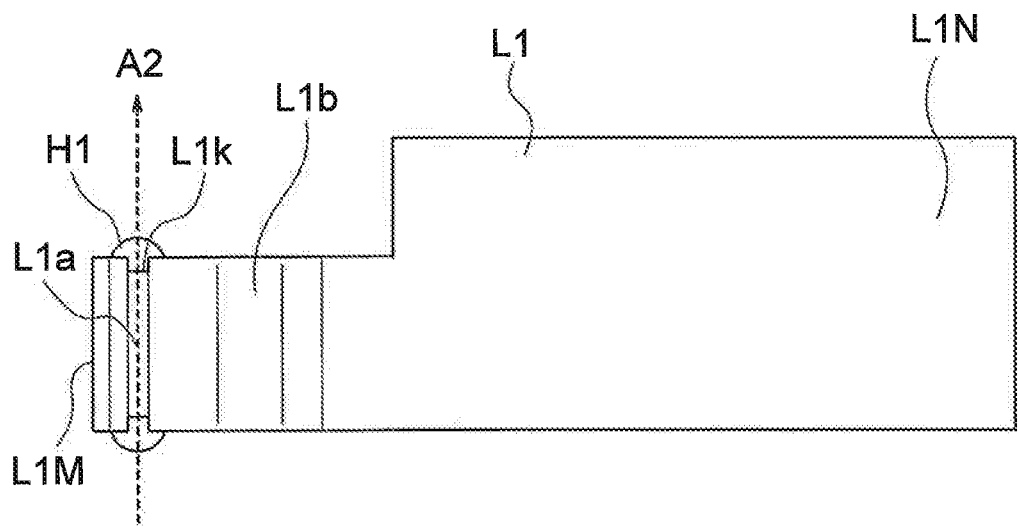
FIG. 8A is a top view showing an example of the configuration of the first lead frame L1 and the first conductive bonding material H1 shown in FIG. 7.
Figure 18B:
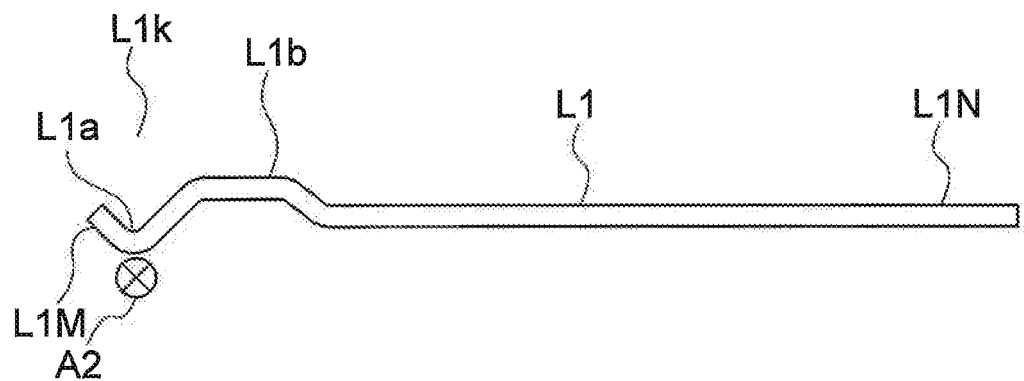
Figure 9:
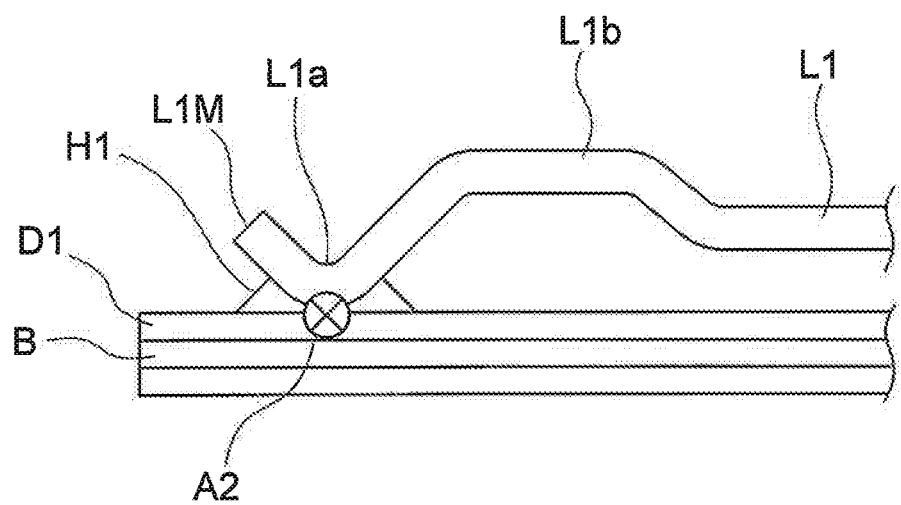
FIG. 9 is a cross-sectional view showing an example of the configuration in the vicinity of one end L1M of the first lead frame L1 shown in FIG. 9.

FIG. 6 is an enlarged perspective view of a region in the vicinity of the first lead frame L1 and the detection lead frame L11 of the semiconductor device 100 shown in FIG. 1. FIG. 7 is a perspective view showing an example of the configuration of the first lead frame L1 and the first conductive bonding material H1 shown in FIG. 6. FIG. 8A is a top view showing an example of the configuration of the first lead frame L1 and the first conductive bonding material H1 shown in FIG. 7. FIG. 8B is a cross sectional view showing an example of the configuration of the first lead frame L1 shown in FIG. 8A. FIG. 9 is a cross sectional view showing an example of a configuration in the vicinity of one end L1M of the first lead frame L1 shown in FIG. 6.

For example, as shown in FIGS. 6 to 9, one end portion L1M of the first lead frame L1 includes a first arch portion L1b and a first bent portion L1a.

The first arch portion L1b is provided so as to protrude upward along the reference direction A2.

The lower surface side of the first bent portion L1a of the first lead frame L1 is in line contact with the upper surface of the first conductive layer D1 along the reference direction A2.

The first conductive bonding material H1 is arranged along the reference direction A2 in which the first bent portion L1a of the first lead frame L1 is in line contact with the upper surface of the first conductive layer D1. The first conductive bonding material H1 bonds between the upper surface of the first conductive layer D1 and the lower surface side of the first bent portion L1a at the end of the substrate B.

Here, as shown in FIGS. 6 to 9, notch portions L1k are formed on the side surfaces on both sides in the reference direction A2 of the portion, in line contact with the first conductive layer D1, of the first bent portion L1a of the first lead frame L1. The notch portions L1k are recessed in the reference direction A2.

And, a part of the first conductive bonding material H1 is embedded in the notch L1k. Thereby, the part of first electroconductive joining material H1 has joined between the upper surface of the first conductive layer D1 and the notch portions L1k of the first bending portion L1a.

The first lead frame L1 is arranged, so that the side direction A1, in which the end of the substrate B extends, and the reference direction A2, in which the line contact region of the first bent portion L1a extends, are parallel to each other, for example, as shown in FIGS. 6 to 9.

The first lead frame L1 has a main body portion that is located between the one end portion L1M and the other end portion L1N, and the main body portion is sealed in the sealing portion 200. And, the position of the upper surface of the first arch portion L1b is higher than the position of the upper surface of the said main body portion.

The width in the side direction A1 of the first arch portion L1b is the same as the width in the side direction A1 other than the cutout portion L1k of the first bent portion L1a. That is, the width in the side direction A1 of the first arch portion L1b is larger than the width in the side direction A1 of the cutout portion L1k of the first bent portion L1a.

Further, for example, the one end L1M and the other end L1N of the first lead frame L1 have the same thickness (that is, the first lead frame L1 is not coined).

Note that the position of the lower surface of the first bent portion L1a is set to be lower than the position of the lower surface of the main body portion.

Then, the first arch portion L1b releases the stress applied to the first lead frame L1 to the sealing portion 200 in the periphery. As a result, application of stress to the first bent portion L1a of the first lead frame L1 is suppressed.

Third Example

In the third example, an example of a method of manufacturing the semiconductor device 100 having the configuration as described above will be described.

FIGS. 10 to 13 are diagrams illustrating an example of a process of a method of manufacturing the semiconductor device 100.

Figure 10:
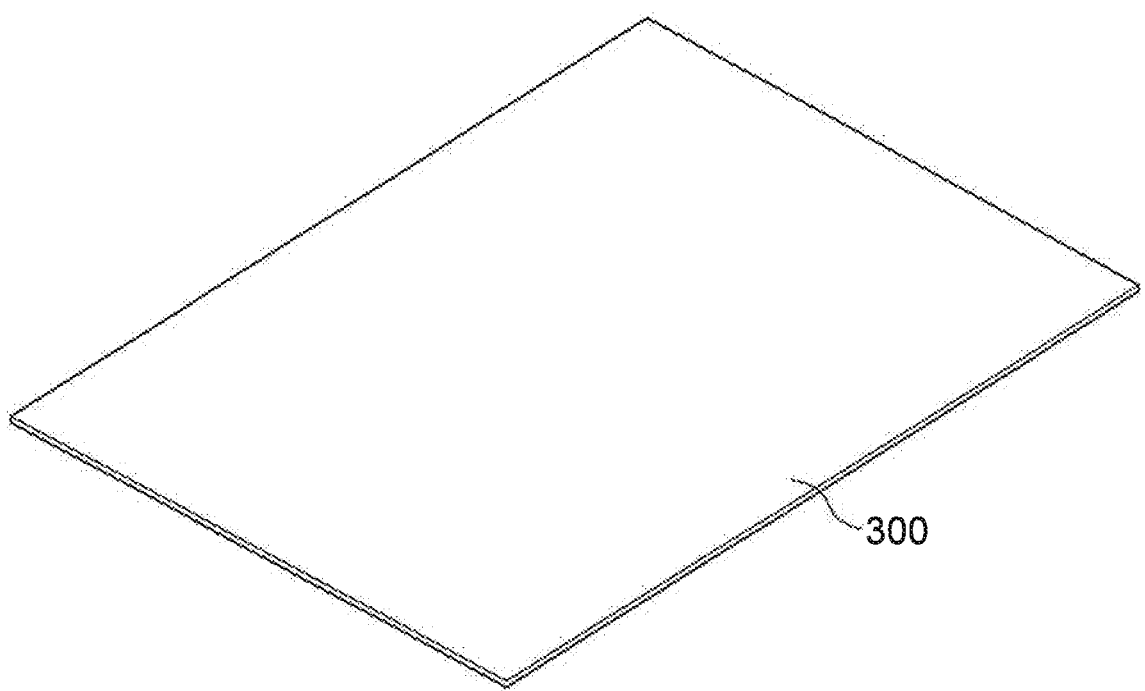
FIG. 10 is a diagram illustrating an example of a process of a method of manufacturing the semiconductor device 100.

First, as shown in FIG. 10, for example, a metal plate 300 made of a metal such as copper is prepared.

Figure 11:
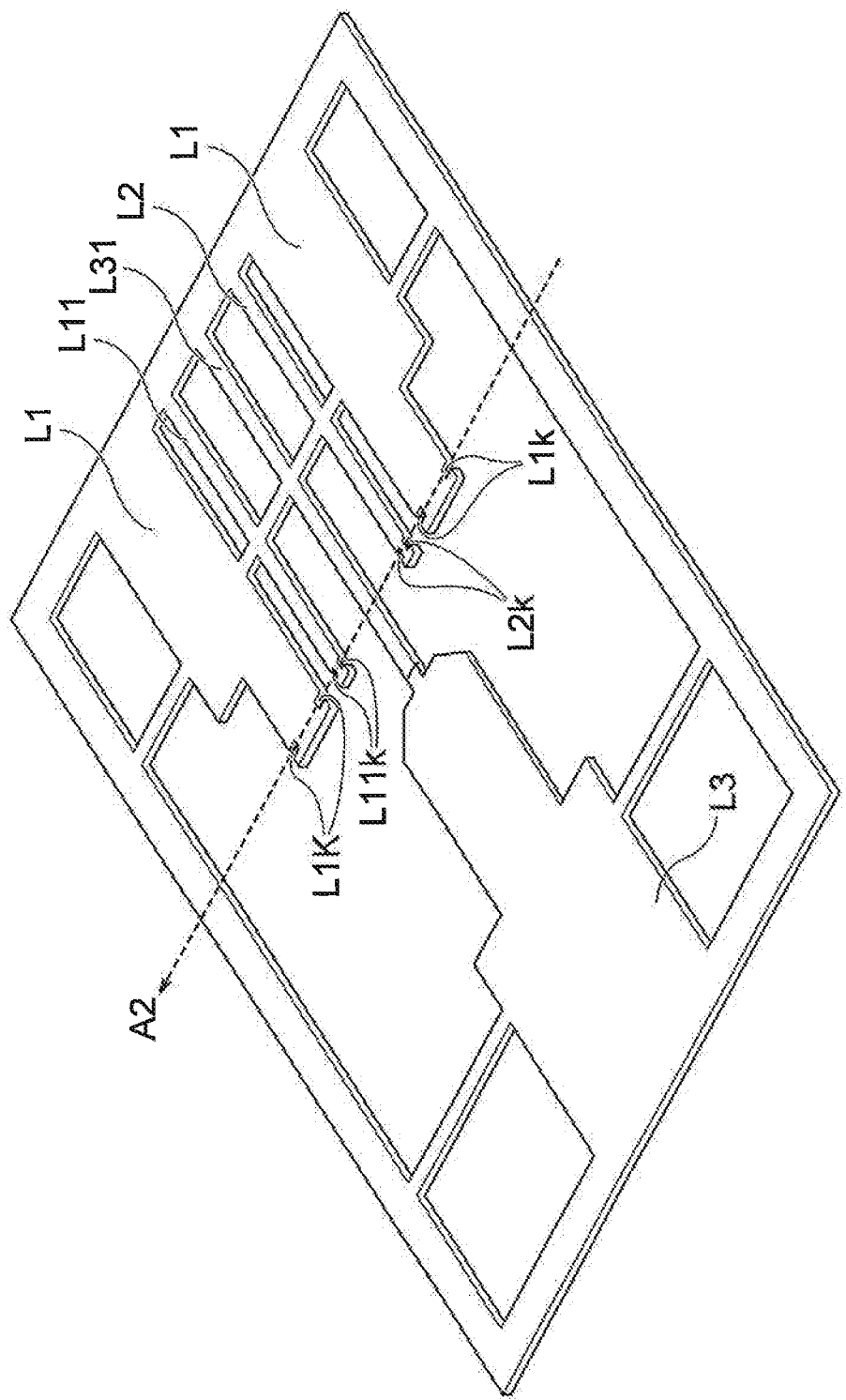
FIG. 11 is a diagram illustrating an example of a process of the method of manufacturing the semiconductor device 100 subsequent to FIG. 10.

Then, as shown in FIG. 11, by selectively punching out the metal plate 300, the first to third lead frames L1 to L3 are simultaneously formed.

In particular, when the first lead frame L1 is formed, notches L1k are formed on both side surfaces in the reference direction A2 of the portion, where the first bent portion L1a of the first lead frame L1 is formed, that is in line contact with the first conductive layer D1. The notches L1k are recessed in the reference direction A2.

In the same way, when the second lead frame L2 is formed, notch portions L2k are formed on both side surfaces in the reference direction A2 of the portion, where the second bent portion L2a of the second lead frame L2 is formed, that is in line contact with the second conductive layer D2. The notch portions L2k are recessed in the reference direction A2.

Figure 12:
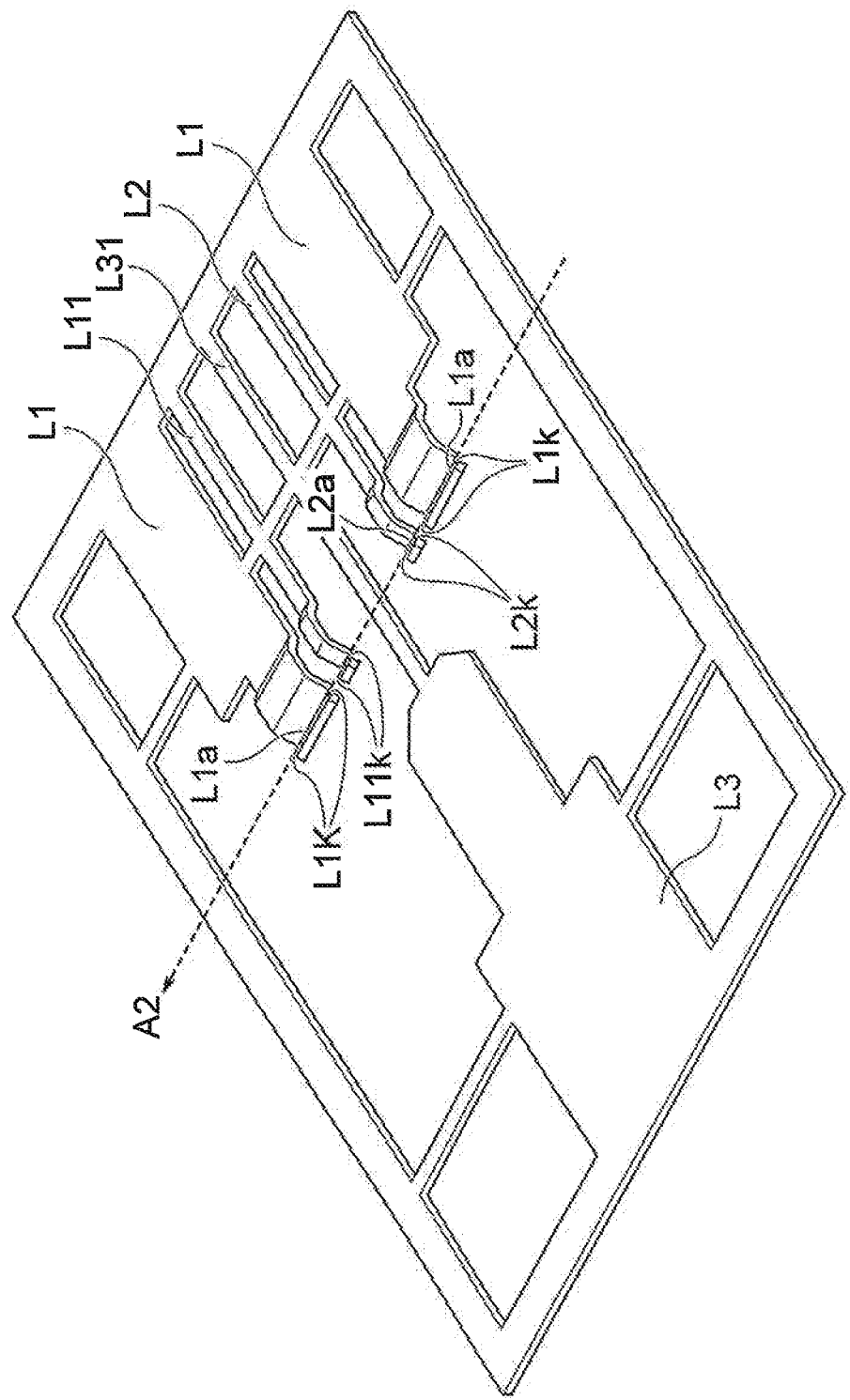
FIG. 12 is a diagram illustrating an example of a process of the method of manufacturing the semiconductor device 100 subsequent to FIG. 11.

Then, as shown in FIG. 12, the one end of the first and second lead frame L1, L2 are bent so as to protrude downward along the reference direction A2. Thereby, the first and second bending portion L1a, L2a are formed.

Figure 13:
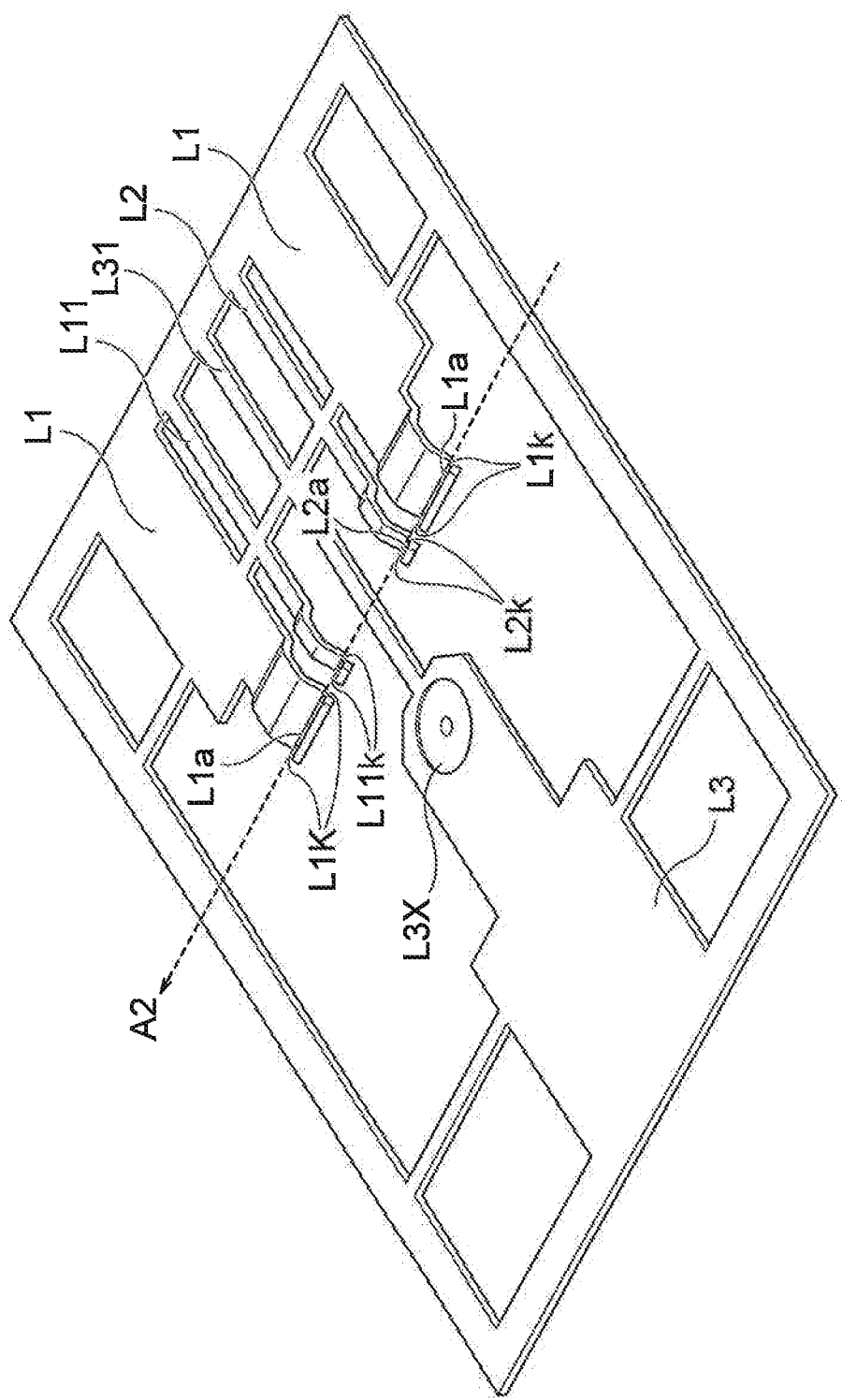
FIG. 13 is a diagram illustrating an example of a process of the method of manufacturing the semiconductor device 100 subsequent to FIG. 12.
Figure 14:
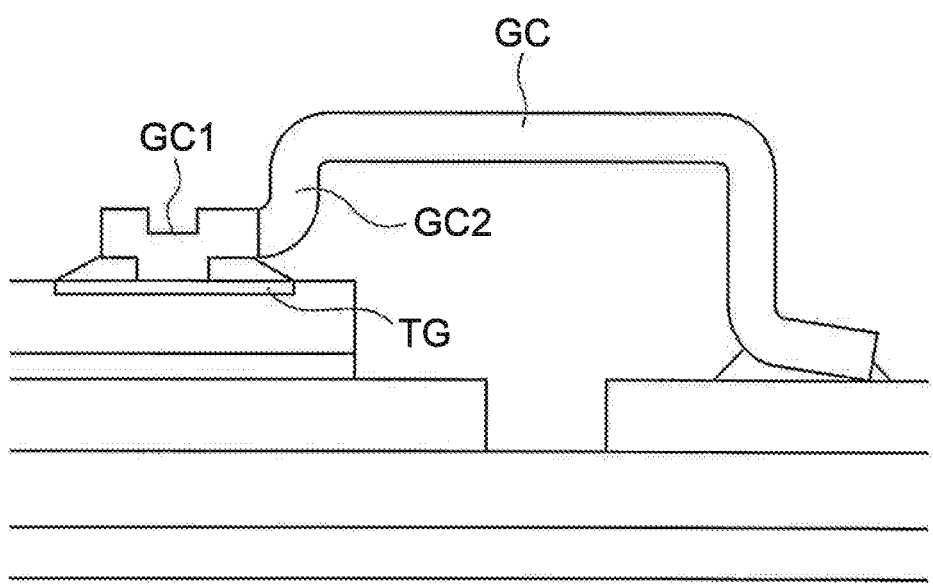
FIG. 14 is a cross sectional view showing an example of a configuration of a connector of a conventional semiconductor device.

Then, as shown in FIG. 13, the third lead frame L3 is subjected to predetermined processing to form a predetermined shape L3X.

Through these steps, for example, the first to third lead frames L1 to L3 shown in FIG. 1 are formed.

Meanwhile, a substrate B having a first conductive layer D1 and a second conductive layer D2 provided on the upper surface is prepared.

Then, the semiconductor element S is arranged on the upper surface of the substrate B. The semiconductor element S has a first terminal TD provided on the lower surface and electrically connected to the first conductive layer D1, and has a second terminal TG provided on the upper surface and to which a control signal is input. Then, by joining the first terminal TD to the first conductive layer D1, the first conductive layer D1 and the first terminal TD are electrically connected.

Thereafter, as shown in FIGS. 5A to 5C, one end of the first lead frame L1 is brought into contact with the upper surface of the first conductive layer D1 provided at the end of the upper surface of the substrate B. Then, the upper surface of the first conductive layer and the lower surface side of the first bent portion of the first lead frame L1 are joined at the end of the substrate B, with the first conductive bonding material H1. Further, a part of the first conductive bonding material H1 is embedded in the notch portions L1k. Thereby, the upper surface of the first conductive layer D1 and the notch portions L1k of the first bent portion L1a are joined.

Similarly, one end of the second lead frame L2 is brought into contact with the upper surface of the second conductive layer D2 provided at the end of the upper surface of the substrate B. Then, at the end of the substrate B, the second conductive layer D2 and one end of the second lead frame L2 are joined by the first control conductive bonding material H2 having electrical conductivity (FIG. 1). At this time, a part of the second conductive bonding material H2 is embedded in the notch L2k. Thereby, the upper surface of the second conductive layer D2 and the cutout portion L2k of the second bent portion L2a are joined.

Further, the one end portion of the third lead frame L3 is brought into contact with the upper surface of the third terminal TS on the upper surface of the semiconductor element S. Then, the third terminal TS and the one end portion of the third lead frame L3 are joined by the source conductive joint material HS having electrical conductivity (FIG. 1).

Then, one end X1 of the connector X is brought into contact with the upper surface of the second terminal TG of the semiconductor element S. Further, the other end X2 of the connector X is brought into contact with the second conductive layer D2. Further, the upper surface of the second terminal of the semiconductor element S and the one end portion X1 of the connector X are bonded by the second control conductive bonding material HG having electrical conductivity. Furthermore, the second conductive layer D2 of the substrate B and the other end portion X2 of the connector X are joined by the third conductive control material HX having electrical conductivity.

Then, as shown in FIGS. 2 and 3, the substrate B, the semiconductor element S, the connector X, the first to third lead frames L1 to L3, and the one end of detection lead frames L11 and L31 are sealed by the sealing portion 200.

Thereafter, by cutting the first to third lead frames L1 to L3 and the detection lead frames L11 and L31, the semiconductor device 100 shown in FIG. 4 is manufactured.

Thus, in this embodiment, after the outer shape of the metal plate 300 is punched, the first and second lead frames L1 and L2 can be formed by two steps of bending the one end of the first and second lead frames L1 and L2. For this reason, the processing cost is reduced, and the thickness of the solder is ensured at the outer peripheral portion of the joint portion, so that stress relaxation is possible.

Further, by forming notch portions (the recessed portions) L1$k$ and L2$k$ on both sides of the first and second bent portions L1$a$ and L2$a$ at the tip (the one end portion) of the first and second lead frames L1 and L2, the first and second bent portions L1$a$ and L2$a$ can be easily bent. Furthermore, since the solder flows into the notch portions L1$k$ and l2$k$, the fixing by the solder can be ensured.

As described above, the tip of the first and second lead frames L1 and L2 are bent by bending. Thus, the bent first and second bent portions L1$a$ and L2$a$ are connected to the first and second conductive layers D1 and D2 by the line contact. For this reason, it is possible to reduce the amount of solder material dispensed.

The semiconductor device according to one embodiment of the present invention includes: a substrate B provided with a first conductive layer D1 and a second conductive layer D2 on an upper surface of the substrate; a semiconductor element S disposed on the upper surface of the substrate, the semiconductor element having: a first terminal provided on a lower surface of the semiconductor element and electrically connected to the first conductive layer, and a second terminal provided on an upper surface of the semiconductor element and the second terminal receiving a control signal; a sealing portion that seals the substrate and the semiconductor element; a control lead frame that has one end in contact with a upper surface of the second conductive layer D2 provided at an end of the upper surface of the substrate in the sealing portion, and that has the other end exposed from the sealing portion; a first control conductive bonding material H2 bonds between the second conductive layer and the one end of the control lead frame at the end of the substrate, and has electrical conductivity; a connector X has a one end portion contacting the upper surface of the second terminal of the semiconductor element in the sealing portion, and the other end in contact with the second conductive layer, the connector electrically connecting the second conductive layer and the second terminal on the upper surface of the semiconductor element; a second control conductive bonding material HG bonds between the upper surface of the second terminal of the semiconductor element and the one end of the connector, and has electrical conductivity; and a third control conductive bonding material HX bonds the second conductive layer of the substrate and the other end of the connector, and has electrical conductivity.

Furthermore, the one end portion of the connector includes: a horizontal portion Xc; a first inclined portion Xb that is connected to the horizontal portion and is located closer to the tip end side of the one end than the horizontal portion, and the first inclined portion having a shape inclined downward from the horizontal portion; and a control bending portion Xa that is connected to the first inclined portion and positioned at the tip of the one end portion, and the control bending portion bent downwardly along the bending axis direction, and wherein a lower surface of the control bending portion Xa is in contact with an upper surface of the second terminal.

In the semiconductor device of the present invention, for example, the control bent portion Xa and the first inclined portion Xb of the connector X joined to the second terminal (gate pad) T2 can be formed only by bending.

Particularly, the lower surface side of the control bent portion Xa is brought into line contact with the center of the upper surface of the second terminal. As a result, when the connector is mounted, a space for preventing the second control conductive bonding material (solder material) H2 from protruding from the second terminal can be provided between the first inclined portion Xb. Thus, the area of the second terminal can be reduced.

That is, in the semiconductor device of the present invention, it is possible to easily process the joint portion of the connector connected to the terminal corresponding to the shape of the terminal to which the control signal is input. Furthermore, it is possible to suppress the conductive bonding material from protruding from the upper surface of the terminal, when the terminal and the connector are bonded.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: semiconductor device
B: substrate
S: semiconductor element
200: sealing portion 200
L1: first lead frame
L11: detection lead frame
H1: first conductive bonding material
L2: second lead frame (control lead frame)
H2: second conductive bonding material (a first control conductive bonding material)
HG: second control conductive bonding material
HX: third control conductive bonding material
X: connector
L3: third lead frame (a source lead frame)
L31: detection lead frame

What is claimed:
1. A semiconductor device comprising:
a substrate provided with a first conductive layer and a second conductive layer on an upper surface of the substrate;
a semiconductor element disposed on the upper surface of the substrate, the semiconductor element having: a first terminal provided on a lower surface of the semiconductor element and electrically connected to the first conductive layer, and a second terminal provided on an upper surface of the semiconductor element and the second terminal receiving a control signal;

a sealing portion that seals the substrate and the semiconductor element;

a lead frame that has one end in contact with a upper surface of the second conductive layer provided at an end of the upper surface of the substrate in the sealing portion, and that has the other end exposed from the sealing portion;

a first control conductive bonding material bonds between the second conductive layer and the one end of the lead frame at the end of the substrate, and has electrical conductivity;

a connector has a one end portion contacting the upper surface of the second terminal of the semiconductor element in the sealing portion, and the other end in contact with the second conductive layer, the connector electrically connecting the second conductive layer and the second terminal on the upper surface of the semiconductor element;

a second control conductive bonding material bonds between the upper surface of the second terminal of the semiconductor element and the one end of the connector, and has electrical conductivity; and a third control conductive bonding material bonds the second conductive layer of the substrate and the other end of the connector, and has electrical conductivity, wherein the one end portion of the connector comprising:
a horizontal portion;
a first inclined portion that is connected to the horizontal portion and is located closer to the tip end side of the one end than the horizontal portion, and the first inclined portion having a shape inclined downward from the horizontal portion; and
a control bending portion that is connected to the first inclined portion and positioned at the tip of the one end portion, and the control bending portion bent downwardly along the bending axis direction, and
wherein a lower surface of the control bending portion is in contact with an upper surface of the second terminal.

2. The semiconductor device according to claim 1, wherein a lower surface side of the control bending portion is in contact with a center of an upper surface of the second terminal.

3. The semiconductor device according to claim 2, wherein the lower surface side of the control bending portion is in line contact with the upper surface of the second terminal in the bending axis direction.

4. The semiconductor device according to claim 3, wherein a thickness of the connector is thinner than a thickness of the lead frame.

5. The semiconductor device according to claim 4, wherein the connector further includes a reference portion connected to the horizontal portion on the side opposite to the first inclined portion, and the reference portion having a width larger than the width of a horizontal portion.

6. The semiconductor device according to claim 5, wherein the other end of the connector has:
a second inclined portion that is connected to the reference portion on the side opposite to the horizontal portion, and that is located closer to the tip end side of the other end portion than the reference portion, the second inclined portion having a shape inclined downward from the reference portion, and
a tip portion that is connected to the second inclined portion, and is located at a tip of the other end portion of the connector,
wherein the tip portion is bonded to the upper surface of the second conductive layer of the substrate by a third control conductive bonding material.

7. The semiconductor device according to claim 6, wherein a height of the lower surface of the control bending portion of the connector from the substrate is higher than a height of the lower surface of the tip portion from the substrate.

8. The semiconductor device according to claim 4, wherein the second control conductive bonding material is arranged along the bending axis direction in which the control bending portion of the connector is in line contact with the upper surface of the second terminal, and the second control conductive bonding material joins between the upper surface of the second terminal and the lower surface side of the control bending portion.

9. The semiconductor device according to claim 8,
wherein the upper surface of the second terminal has a rectangular shape, and
wherein the second control conductive bonding material is positioned so as to surround the center of the upper surface of the second terminal, and the second control conductive bonding material joins between the lower surface of the control bending portion of the connector and the upper surface of the second terminal.

10. The semiconductor device according to claim 9,
wherein the lower surface side of the control bending portion is in line contact with and the upper surface of the second terminal in the bending axis direction passing through the center of the upper surface of the second terminal, and
wherein the bending axis direction is parallel to one side of the rectangle of the second terminal.

11. The semiconductor device according to claim 5, wherein a width of the control bending portion in the bending axis direction is the same as a width of the first inclined portion in the bending axis direction.

12. The semiconductor device according to claim 5, wherein a width of the control bending portion in the bending axis direction is smaller than a width of the reference portion in the bending axis direction.

13. The semiconductor device according to claim 4,
wherein the semiconductor element is a MOSFET having the first terminal that is a drain terminal, the second terminal that is a gate terminal, and a source terminal which is a third terminal on the upper surface of the MOSFET, the third terminal having an area larger than an area of the second terminal, and
wherein the lead frame is a control lead frame for transmitting the gate signal of the MOSFET.

14. The semiconductor device according to claim 13, further comprising:
a drain lead frame having one end electrically connected to the first terminal, which is a drain terminal in the sealing portion, and having the other end exposed from the sealing portion; and
a source lead frame having one end electrically connected to the third terminal, which is a source terminal in the sealing portion, and having the other end exposed from the sealing portion.

15. A method of manufacturing a semiconductor device comprising:
- preparing a substrate provided with a first conductive layer and a second conductive layer on an upper surface of the substrate;
- arranging a semiconductor element on the upper surface of the substrate, the semiconductor element having: a first terminal provided on a lower surface of the semiconductor element and electrically connected to the first conductive layer, and a second terminal provided on an upper surface of the semiconductor element and the second terminal receiving a control signal;
- bringing one end of a lead frame into contact with a upper surface of the second conductive layer provided at an end of the upper surface of the substrate;
- bonding between the second conductive layer and the one end of the lead frame at the end of the substrate by a first control conductive bonding material, and the first control conductive bonding material has electrical conductivity;
- bringing a one end portion of a connector into contact with the upper surface of the second terminal of the semiconductor element, and the other end of a connector into contact with the second conductive layer;
- bonding between the upper surface of the second terminal of the semiconductor element and the one end of the connector by a second control conductive bonding material, and the second control conductive bonding material has electrical conductivity;
- bonding the second conductive layer of the substrate and the other end of the connector by a third control conductive bonding material, and the third control conductive bonding material has electrical conductivity; and
- sealing the substrate, the semiconductor element, and the one end of the lead frame by a sealing portion,
- wherein the one end portion of the connector comprising:
  - a horizontal portion;
  - a first inclined portion that is connected to the horizontal portion and is located closer to the tip end side of the one end than the horizontal portion, and the first inclined portion having a shape inclined downward from the horizontal portion; and
  - a control bending portion that is connected to the first inclined portion and positioned at the tip of the one end portion, and the control bending portion bent downwardly along the bending axis direction, and
- wherein a lower surface of the control bending portion is in contact with an upper surface of the second terminal.

* * * * *